(12) United States Patent
Kameya

(10) Patent No.: US 8,922,303 B2
(45) Date of Patent: Dec. 30, 2014

(54) COMMON MODE FILTER

(75) Inventor: Masaaki Kameya, Kanagawa (JP)

(73) Assignee: Elmec Corporation, Kawasaki (JP)

( * ) Notice: Subject to any disclaimer, the term of this patent is extended or adjusted under 35 U.S.C. 154(b) by 729 days.

(21) Appl. No.: 13/145,733

(22) PCT Filed: Jul. 21, 2010

(86) PCT No.: PCT/JP2010/062208
§ 371 (c)(1),
(2), (4) Date: Jul. 21, 2011

(87) PCT Pub. No.: WO2011/013543
PCT Pub. Date: Feb. 3, 2011

(65) Prior Publication Data
US 2011/0279197 A1 Nov. 17, 2011

(30) Foreign Application Priority Data

Jul. 27, 2009 (JP) ................................ 2009-174199

(51) Int. Cl.
*H01P 1/203* (2006.01)
*H03H 7/42* (2006.01)
*H01F 17/00* (2006.01)
*H03H 1/00* (2006.01)

(52) U.S. Cl.
CPC ........... *H01P 1/20345* (2013.01); *H03H 7/427* (2013.01); *H01P 1/2039* (2013.01); *H01F 17/0006* (2013.01); *H03H 2001/0085* (2013.01)
USPC .................................. 333/204; 333/4; 333/12

(58) Field of Classification Search
CPC ...... H03H 7/427; H01P 1/203; H01P 1/20345
USPC ............................ 333/4, 5, 12, 181, 185, 204
See application file for complete search history.

(56) References Cited

U.S. PATENT DOCUMENTS 4,983,934 A 1/1991 Okumura
5,126,707 A 6/1992 Ikeda
(Continued)

FOREIGN PATENT DOCUMENTS

JP 2-035810 A 2/1990
JP 4-002108 A 1/1992
(Continued)

OTHER PUBLICATIONS

Lui et al., A Novel Broadband Common-Mode Filter for High-Speed Differential Signals; May 19-22, 2008; IEEE 2008 Asia-Pacific Symposium on Electromagnetic Compatibility, Singapore pp. 355-358.*

(Continued)

*Primary Examiner* — Benny Lee
*Assistant Examiner* — Rakesh Patel
(74) *Attorney, Agent, or Firm* — Westerman, Hattori, Daniels & Adrian, LLP

(57) ABSTRACT

To sufficiently attenuate a common mode signal by passing an ultra-high speed differential signal through an ultra-high speed differential transmission line. A common mode filter comprises: a pair of conductive lines formed on a first dielectric layer to transmit a differential signal; a plurality of first divided floating grounds in a state of being separated from an external ground potential, and facing the conductive lines, with the first dielectric layer interposed between them, and formed by being divided into a plurality of numbers in a length direction of the conductive lines, and forming a distribution constant type differential transmission line for the differential signal, together with the conductive lines; and a first passive two-terminal network connected between the first divided floating grounds located at least at an input side or an output side of the first divided floating grounds, and the external ground potential.

15 Claims, 17 Drawing Sheets

(56) References Cited

U.S. PATENT DOCUMENTS 5,278,526 A 1/1994 Ikeda
2011/0032048 A1* 2/2011 Wu et al. .................. 333/12

FOREIGN PATENT DOCUMENTS

| JP | 6-224045 A | 8/1994 |
| JP | 2000-058343 A | 2/2000 |
| JP | 2003-318687 A | 11/2003 |

OTHER PUBLICATIONS

International Search Report for PCT/JP2010/62208, mailing date of Sep. 7, 2010.

* cited by examiner

Prior Art

Prior Art

COMMON MODE FILTER

BACKGROUND OF THE INVENTION

1. Technical Field of the Invention

The present invention relates to a common mode filter, and particularly relates to a new common mode filter that secures a passage of an ultra high-speed differential signal propagated through an ultra high-speed differential transmission line, and attenuates a common mode signal.

2. Description of Related Art

In recent years, high-definition video contents such as "HDTV: high definition television" and "Blue-ray Disc" become widespread, and in order to transmit a vast amount of digital data for supporting such contents, high-speed serial transmission has been used.

In the high-speed serial transmission, a voltage amplitude needs to be reduced for shortening a rise time, and therefore this transmission easily receives an influence of a noise. Therefore, in order to hardly receive the influence of the noise, a differential transmission of a signal is generally used.

In a differential transmission system, smaller amplitude is secured for accelerating a transmission speed and realizing proper power saving by simultaneously transmitting positive phase and opposite phase differential signals to each of a pair of two lines, and a common mode signal such as an outside noise is canceled.

However, in the differential transmission system, a function of canceling the common mode signal such as an outside noise is insufficient, and therefore a common mode chalk coil is inserted into a differential transmission line, for preventing its adverse influence.

Conventionally, although not shown, it is generally known that in such a kind of common mode chalk coil, there is a magnetic core having two conducting wires wound thereon, with the same number of turns. FIG. 16 shows its circuit view.

In the common mode chalk coil with this structure, currents of differential signals flowing through the two conducting wires offset each other with opposite phases, thus generating no magnetic flux, and impedance of two conducting wires can be maintained to be low. Therefore, the differential signals can be easily passed.

Meanwhile, in a case of the common mode signal, currents flow through the two conducting wires, with the same phases, thus generating the magnetic flux in the magnetic body, and the impedance of the two conducting wires becomes high, to make it difficult to pass the signals. Therefore, the common mode signal is attenuated.

Japanese Patent Laid Open Publication No. 2000-58343 (patent document 1) discloses a common mode chalk coil for differential transmission line, which corresponds to the structure of FIG. 16 as described above.

According to the patent document 1, two coil conductors are wrapped around a toroidal core, and the toroidal core is housed in a package case made of resin. The package case consists of a case and a lid. Ground conductors are formed by plating on outer surfaces of an external wall, a bottom wall, and the lid of the case. Insulating films are formed on the ground conductors. Terminal plates are bonded respectively to the insulating films, and the ends of the coil conductors are soldered to the terminal plates, to thereby make a characteristic impedance correspond to a transmission line so as to prevent signal reflection.

(Patent Document 1)

Japanese Patent Laid Open Publication No. 2000-53343

DISCLOSURE OF THE INVENTION

Problem to be Solved by the Invention

In recent years, in the aforementioned differential transmission system, a transmission speed of 3G bits/second to 6G bits/second has been requested, and in the near future, it is said that the transmission speed of 8G to 16G bits/second is requested.

However, if a common mode chalk coil having the aforementioned structure shown in FIG. 16 is constituted corresponding to a highest frequency, only the transmission characteristics Scd21 of a differential signal and the transmission characteristics Scc21 of a common mode signal as shown in FIG. 17 can be obtained.

As is clarified from FIG. 17, the transmission characteristic Scc21 of the common mode signal is formed into a V-shape, wherein in a range of 2 to 3 GHz, although attenuation of about −20 dB is obtained, in a range of 8 to 10 GHz, only a slight attenuation is obtained, and it is difficult to sufficiently attenuate the common mode signal.

Namely, in a conventional structure of FIG. 16, the transmission characteristic Scc21 of the common mode signal is marginal, thus hardly responding to successful transmission of an ultra high-speed differential signal which is required from now.

Further, the common mode signal not passing through the transmission line is possibly reflected from input terminals of the common mode chalk coil and propagated through the transmission line in an opposite direction, and electromagnetically radiated to outside at the time of reflection, to thereby easily cause a noise.

Particularly, a signal of a GHz band has a short wavelength, and therefore there is a high probability that the wavelength of this signal is equal to the integral multiple of a circuit pattern length, thus highly possibly electromagnetically radiating this signal, with the circuit pattern as an antenna.

Therefore, in a signal of low frequency with no possibility of electromagnetic radiation, there is no practical problem even if the common mode signal is reflected from the input terminals. However, a problem is that the reflection of the common mode signal of high frequency can not be ignored.

In order to solve the above-described problem, the present invention is provided, and an object of the present invention is to provide a common mode filter capable of making a desirable ultra high-speed differential signal pass through an ultra high-speed differential transmission line successfully, and capable of cutting-off an undesirable common mode signal by reflection and also absorbing or attenuating this signal inside.

SUMMARY OF THE INVENTION

Means for Solving the Problem

In order to solve the above-described problem, the common mode filter according to a first aspect of the present invention comprises:

a pair of conductive lines formed on a first dielectric layer to transmit a differential signal;

a plurality of first divided floating grounds separated from an external ground potential in such a manner as facing the conductive lines, with the first dielectric layer interposed between them, and divided into a plurality of numbers in a length direction of the conductive lines, thus forming a distribution constant type differential transmission line for the differential signal, together with the conductive lines; and a first passive two-terminal network connected between the first divided floating grounds located at least at an input side or an output side of the first divided floating grounds, and the external ground potential.

The common mode filter according to another aspect of the present invention has a structure, wherein the first divided floating grounds are constituted as a pair at the input side and the output side.

The common mode filter according to another aspect of the present invention has a structure, wherein three or more first divided floating grounds are formed.

The common mode filter according to another aspect has a structure, wherein the first passive two-terminal network is also connected between all adjacent grounds or a part of the adjacent grounds of the first divided floating grounds.

The common mode filter according to another aspect of the present invention has a structure, wherein common first passive two-terminal networks are connected to the plurality of adjacent first divided floating grounds.

The common mode filter according to another aspect of the present invention has a structure, wherein the conductive lines are formed into meander shapes.

The common mode filter according to another aspect of the present invention has a structure, wherein a plurality of spiral conductive lines are connected in series in a length direction.

The common mode filter according to another aspect of the present invention has a structure, wherein the conductive lines are formed on a dielectric substrate, being the first dielectric layer, and the first divided floating grounds are formed on a dielectric substrate different from the aforementioned dielectric substrate, and such different dielectric substrates are formed by integral lamination.

The common mode filter according to another aspect of the present invention has a structure, comprising a second floating ground, which is separated from the external ground potential and is formed in such a manner as facing the conductive lines, with a second dielectric layer interposed between them, thus forming a distribution constant type differential transmission line.

The common mode filter according to another aspect of the present invention has a structure, comprising a second passive two-terminal network, which is connected between the second floating ground and the external ground potential.

The common mode filter according to another aspect of the present invention has a structure, wherein the second floating ground is divided into a plurality of numbers in a length direction of the conductive lines, and the second passive two-terminal network is connected between the second divided floating grounds located at least at an input side or an output side of the plurality of second divided floating grounds, and the external ground potential.

The common mode filter according to another aspect of the present invention has a structure, wherein the second passive two-terminal network is also connected between all adjacent grounds or a part of the adjacent grounds of the second divided floating grounds.

The common mode filter according to another aspect of the present invention has a structure, wherein the conductive lines are formed on a dielectric substrate, being the first dielectric layer, and the first divided floating grounds are formed on a dielectric substrate different from the aforementioned dielectric substrate, and the second floating grounds are formed on a dielectric substrate, being the second dielectric layer, and such different dielectric substrates are formed by integral lamination.

The common mode filter according to another aspect of the present invention has a structure, wherein the first and the second passive two-terminal networks are short circuit lines.

The common mode filter according to another aspect of the present invention has a structure, wherein the first and the second passive two-terminal networks are formed by an inductor, a capacitor, a resistor, or a combination of them, being one or more passive elements.

Advantage of the Invention

According to the common mode filter of a first aspect of the present invention with such a structure, a pair of conductive lines are formed on the first dielectric layer for transmitting the differential signal, with the first dielectric layer interposed between them, and the first divided floating grounds are formed in a state of facing the conductive lines and being divided into a plurality of numbers in the length direction, with the first passive two-terminal network connected between the first divided floating grounds at the input side or the output side of the first divided floating grounds, and the external ground potential. Therefore, the distribution constant type differential transmission line for the differential signal is formed by the conductive lines and the first divided floating grounds, and a series resonance circuit for the common mode signal is formed by the conductive lines and the first passive two-terminal network. Then, in the ultra high-speed differential transmission line, a desirable ultra high-speed differential signal can be passed successfully, while cutting-off and absorbing inside an undesirable common mode signal.

According to the common mode filter of another aspect of the present invention, a pair of the first divided floating grounds are formed at the input side and the output side. Therefore, in addition to the above-described effect, the structure is simplified.

According to the common mode filter of another aspect of the present invention, three or more first divided floating grounds are formed. Therefore, various attenuation characteristics of the common mode signal can be obtained.

According to the common mode filter of another aspect of the present invention, the first divided floating grounds have the first passive two-terminal network connected between all adjacent grounds or a part of the adjacent grounds. Therefore, various attenuation characteristics for the common mode signal can be obtained.

According to the common mode filter of another aspect of the present invention, common first passive two-terminal networks are connected to the plurality of adjacent first divided floating grounds. Therefore, various attenuation characteristics of the common mode signal can be obtained.

According to the common mode filter of another aspect of the present invention, the conductive lines are formed into meander shapes. Therefore, in addition to the above-described effect, delay characteristics of a desirable ultra high-speed differential signal can be arbitrarily set.

According to the common mode filter of another aspect of the present invention, a plurality of spiral-shaped conductive lines are connected in series in the length direction. Therefore, in addition to the above-described effect, the delay characteristics of the desirable ultra high-speed differential signal can be increased.

According to the common mode filter of another aspect of the present invention, the conductive lines are formed on the dielectric substrate, being the first dielectric layer, and the first divided floating grounds are formed on the dielectric substrate different from the aforementioned dielectric substrate and mutually different such dielectric substrates are formed by integral lamination. Therefore, a chip type structure can be easily obtained.

According to the common mode filter of another aspect of the present invention, the second floating ground is provided in a state of being separated from the external ground potential in such a manner as facing the conductive lines, with the second dielectric layer interposed between them, thus forming the distribution constant type differential transmission line. Therefore, the above-described effect is obtained in a stripline structure.

According to the common mode filter of another aspect of the present invention, the second passive two-terminal network is provided, which is connected between the second floating ground and the external ground potential. Therefore, in the stripline structure, further excellent effect can be obtained.

According to the common mode filter of another aspect of the present invention, the second passive two-terminal network is connected between the second divided floating grounds of the plurality of divided second floating grounds located at least at the input side or the output side, and the external ground potential. Therefore, in the stripline structure, further excellent effect can be obtained, and simplification of the structure can be maintained.

According to the common mode filter of another aspect of the present invention, the second passive two-terminal network is also connected between all adjacent grounds or a part of the adjacent grounds of the second divided floating grounds. Therefore, in the stripline structure, the aforementioned various effects can be obtained.

According to the common mode filter of another aspect of the present invention, the dielectric substrate, being the first dielectric layer with the conductive lines formed thereon, and the dielectric substrate with the first divided floating grounds formed thereon, and the dielectric substrate with the second floating grounds formed thereon, are formed by integral lamination. Therefore, in the stripline structure, the chip type structure can be easily obtained.

According to the common mode filter of other aspects of the present invention, the first and the second passive two-terminal networks are formed by the short circuit line, the inductor, capacitor, resistor, and the combination of them, as one or more passive elements. Therefore, with a simple element structure, the aforementioned various effects can be obtained.

DESCRIPTION OF PREFERRED EMBODIMENTS OF THE INVENTION

Preferred embodiments of the present invention will be described hereafter, with reference to the drawings.

Figure 1:
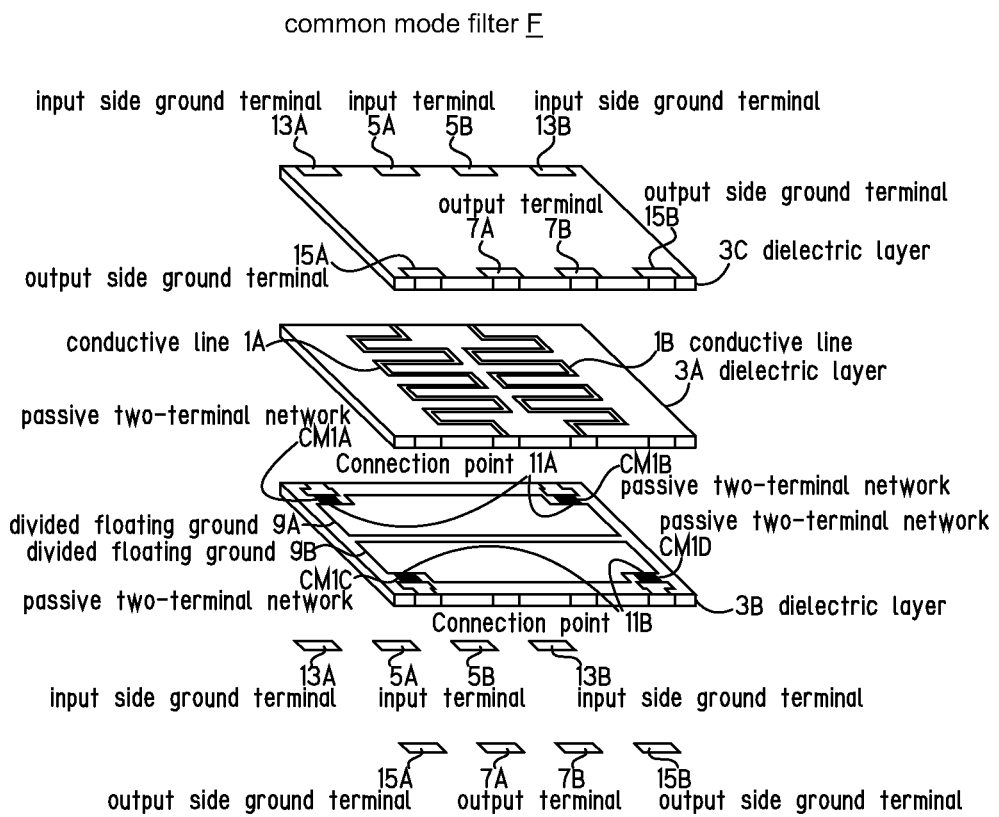
FIG. 1 is an exploded perspective view for explaining a basic structure of a common mode filter of the present invention.

FIG. 1 is an exploded perspective view showing a basic structure of a common mode filter F according to the present invention.

In FIG. 1, a pair of rectangular meander conductive lines 1A and 1B are farmed between both opposite edges of the dielectric layer 3A on one surface (on an upper surface in FIG. 1) of a rectangular dielectric layer 3A which is composed of a dielectric substrate such as baked ceramics, by a conventionally known printing method. The conductive lines 1A and 1B are connected to input terminals 5A and 5B, and output terminals 7A and 7B formed on different opposite edges of the dielectric layer 3A. In the figure, such input terminals 5A, 5B, and output terminals 7A, 7B are shown in parts different from the part of the dielectric layer 3A, for convenience.

The conductive lines 1A, 1B, and the input/output terminals 5A, 5B, 7A, 7B are arranged in line symmetry with a virtual line (not shown) passing between the conductive lines 1A and 1B.

A dielectric layer 3B composed of the dielectric substrate having the same shape as the shape of the dielectric layer 3A and made of the same material as the material of the dielectric layer 3A, is disposed under the dielectric layer 3A.

Divided floating grounds 9A and 9B are formed by the publicly-known printing method, approximately on an entire area of the one surface (upper surface in FIG. 1) of the dielectric layer 3B. The divided floating grounds 9A and 9B are formed in parallel independently of each other at a small interval, in an area dividing a direction between the input terminals 5A, 5B and the output terminals 7A, 7B, into two equal parts, on the dielectric layer 3B, in such a manner as facing the conductive lines 1A, 1B through the dielectric layer 3A.

On the divided floating ground 9A in the same surface of the dielectric layer 3B, connection points 11A are formed on the ends close to the input terminals 5A and 5B, so that passive two-terminal networks CM1A and CM1B are connected between the input side ground terminals 13A, 13B and connection points 11A. Also, on the divided floating ground 9B, connection points 11B are formed on the ends close to the output terminals 7A, 7B, and passive two-terminal networks CM1C, CM1D are connected between the output side ground terminals 15A, 15B and connection points 11B.

The passive two-terminal networks CM1A to CM1D are formed by connection pieces as short-circuit lines, inductors by fold-back lines or the like, capacitors by flat electrodes, or resistive films, and are formed on the dielectric layer 3B.

A dielectric layer 3C composed of the dielectric substrate having the same shape as the shape of the dielectric layer 3A and made of the same material as the material of the dielectric layer 3A, is disposed above the dielectric layer 3A. In the same way as the dielectric layer 3A, on the opposite edges of the dielectric layer 3C, the input side ground terminals 13A, 13B and the output side ground terminals 15A, 15B are formed.

Then, mutually different dielectric layers 3A, 3B, 3C are overlapped one another and formed into a chip shape and integrated with one another, thus constituting a micro-strip distribution constant type common mode filter F.

The input/output terminals 5A to 7B, the input side ground terminals 13A, 13B, and the output side ground terminals 15A, 15B formed on the dielectric layers 3A to 3C, are similarly integrally formed, when the dielectric layers 3A to 3C are overlapped one another and formed integrally into the chip shape.

Figure 2:
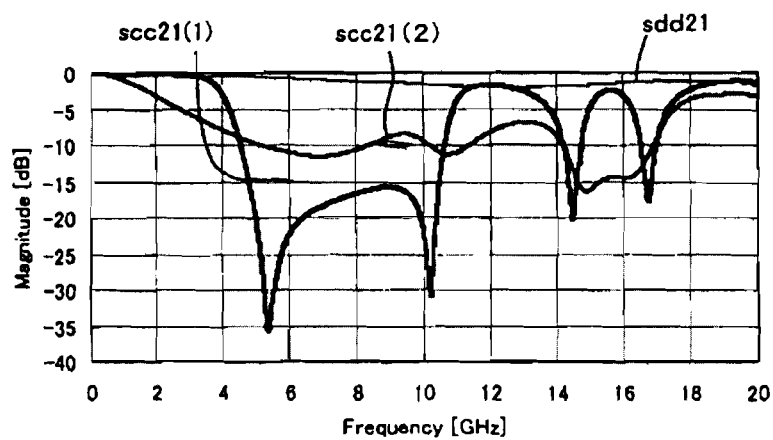
FIG. 2 is a transmission characteristic view of the common mode filter of FIG. 1.

FIG. 2 shows a result of performing electromagnetic field analysis in the structure of FIG. 1, wherein a delay time of a micro strip distribution constant type differential transmission line is set to 100 ps, and the passive two-terminal networks CM1A to CM1D are formed as the connection pieces with a width of 0.3 mm (short-circuit lines) and the resistive films of 50 ohms having the same shape as the shape of the connection pieces, and further the floating grounds 9A, 9B are divided in a center.

In FIG. 2, curve lines Scc21(1) and Scc21(2) show common mode signal transmission characteristics respectively under the following conditions.

Scc21(1): The passive two-terminal networks CM1A to D are short-circuit lines with a width of 0.3 mm.

Scc21(2): The passive two-terminal networks CM1A to D are resistive films of 50 ohms with a width of 0.3 mm.

Note that when the passive two-terminal networks CM1A to CM1D are formed as the resistive films of 50 ohms with a width of 0.3 mm, Sdd21 shows a differential signal transmission characteristic.

As is clarified from Scc21(1) of FIG. 2, when the passive two-terminal networks CM1A to CM1D are the short-circuit lines, an attenuation frequency band of the common mode signal falls within a range of about 4 to 11 GHz, and particularly attenuation of 15 dB or more is obtained in a range of 5 to 10.5 GHz. Further, when the passive two-terminal networks CM1A to CM1D show the resistance of 50 ohms, as shown by Scc21(2), an amount of the attenuation of the common mode signal is smaller than that of the Scc21(1), but a constant amount of attenuation can be obtained in a further broad band, and the attenuation of 5 to 15 dB can be obtained particularly in a frequency range of 3 to 17 GHz.

Although not shown, in a structure of undivided floating grounds, the common mode signal passes in the band of direct current (DC) to 10 GHz or more, which makes it difficult to put a filter with this structure to practical use as the common mode filter F.

Next, by using the divided floating grounds 9A, 9B, the attenuation of the satisfactory common mode signal is obtained, and the reason therefore will be examined.

Figure 3:
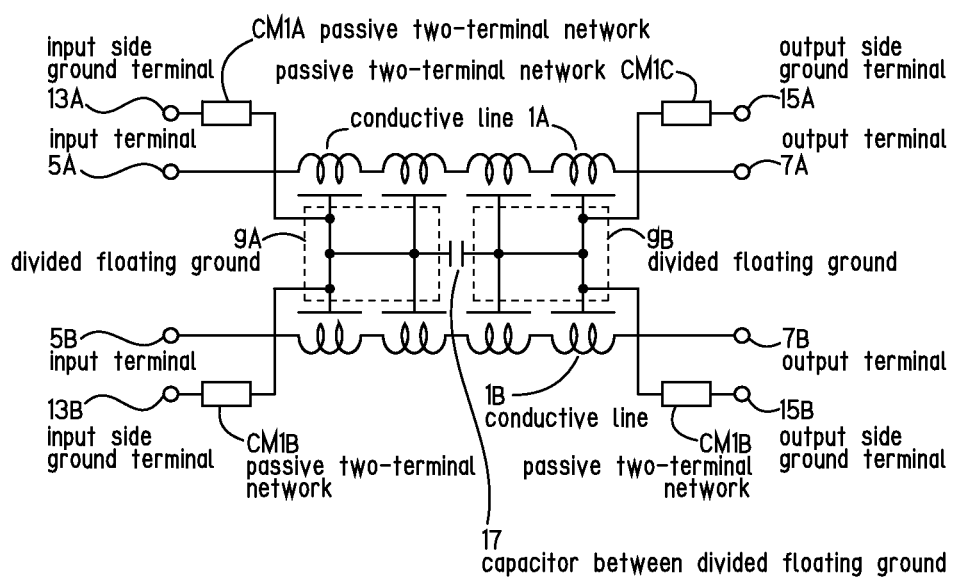
FIG. 3 is an equivalent circuit regarding the common mode filter of FIG. 1.

FIG. 3 shows an equivalent circuit in the structure of FIG. 1. Capacitor 17 between the divided floating grounds exists between the divided floating grounds 9A and 9B.

In order to obtain the transmission characteristics close to the result of electromagnetic field analysis, the number of section and a circuit constant are selected and an equivalent circuit is prepared with the conductive lines 1A and 1B in a form of a lumped constant circuit. However, here description of its accurate circuit constant is omitted, and the description of the circuit constant is simplified as shown in FIG. 3.

A capacitance value of the capacitor 17 between the divided floating grounds, and an inductance value of the passive two-terminal networks CM1A to CM1D, being the short-circuit lines with a width of 0.3 mm, are obtained by extraction of constants by electromagnetic field analysis, so as to obtain the characteristics of FIG. 2. Then, it is found that the capacitor 17 between the divided floating grounds shows 0.5 pF, and the inductance of the passive two-terminal networks CM1A to CM1D shows 0.6 nH.

Figure 4:
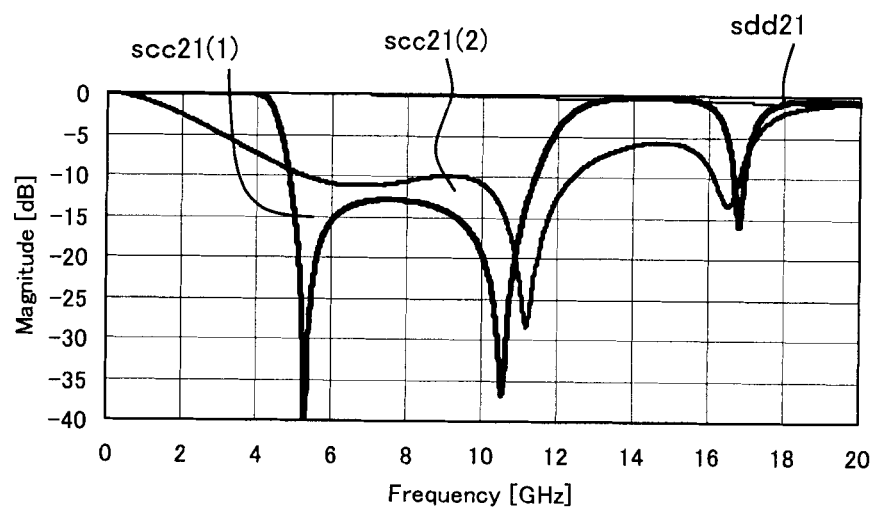
FIG. 4 is a transmission characteristic view of the equivalent circuit of FIG. 3.

FIG. 4 shows the result of a circuit simulation of the equivalent circuit shown in FIG. 2. Scc21(1) and Scc21(2) show common mode signal transmission characteristics under the following conditions.

Scc21(1): Passive two-terminal networks CM1A to CM1D are inductors of 0.6 nH (corresponding to the short-circuit line with a width of 0.3 mm)

Scc21(1): Passive two-terminal networks CM1A to CM1D are serial connection between a resistor of 50 ohms and an inductor of 0.6 nH (corresponding to a resistive film of 50 ohms with a width of 0.3 mm)

Note that Sdd21 shows the differential signal transmission characteristics, when the passive two-terminal networks CM1A to CM1D are formed into a series circuit of the resistor of 50 ohms and the inductor of 0.6 nH.

When the result of FIG. 4 is compared with the result of FIG. 2, it is found that although there is a slight difference in a range of 11 to 15 GHz, excellent agreement can be obtained in a range of 10 GHz or less in both cases, and it can be said that the equivalent circuit of FIG. 3 successfully shows the structure of FIG. 1.

Note that the capacitor 17 between the divided floating grounds can be adjusted, depending on a gap dimension between the divided floating grounds. In other words, a capacitor, being the passive two-terminal network, is connected between the divided floating grounds. Further, although not shown, the common mode transmission characteristics can also be adjusted by connecting other passive two-terminal network between the divided floating grounds.

In the equivalent circuit of FIG. 3, the characteristics as shown in FIG. 4 can be obtained, and the reason therefore is considered as follows.

Differential signals applied to the conductive lines 1A and 1B are mutually opposite phases between lines. Therefore, currents flowing toward the divided floating grounds 9A and 9B from the conductive lines 1A and 1B are also opposite phases, and are mutually canceled in the divided floating grounds 9A and 9B, and do not flow to the capacitor 17 between the divided floating grounds and the passive two-terminal networks CM1A to CM1D.

Meanwhile, common mode signals applied to the conductive lines 1A and 1B are the same phases, and therefore flow to an external ground potential through the capacitor 17 between the divided floating grounds, and the passive two-terminal networks CM1A to CM1D from the divided floating grounds 9A and 9B. Namely, the capacitor 17 between the divided floating grounds and the passive two-terminal networks CM1A to CM1D are elements effective only for the common mode signal.

Here, when the passive two-terminal networks CM1A to CM1D are the short-circuit lines, they have inductor components, thus forming a series resonance circuit for the common mode signal, together with the capacitor 17 between the divided floating grounds. With this structure, the divided floating grounds 9A and 9B do not function as the grounds for the common mode signal. Therefore, the conductive lines 1A and 1B do not function as the transmission lines for the common mode signal, the inductor and the capacitor constituting the conductive lines 1A and 1B, are connected to the series resonance circuit in series, and a composite resonance circuit is formed by them. As a result, a resonance curve as shown by Scc21(1) of FIG. 4 is obtained. Thus, the filter functions for the common mode signal.

In this case, as a delay time becomes larger, time constants such as inductance and capacitance of the conductive lines 1A and 1B become large accordingly, and a resonance frequency becomes low. Namely, as the delay time becomes larger, the common mode signal can be attenuated from the lower frequency.

Further, when the passive two-terminal networks CM1A to CM1D are the resistive films, outer shape is the same shape as the shapes of the short-circuit lines, thus having an inductance component, and such elements can be regarded as series elements of the resistor and the inductor in the form of the equivalent circuit.

Then, by interposing the resistor in the resonance circuit, the transmission characteristics show a broad resonance curve as shown by Scc21(2) of FIG. 4, wherein drop of "Q" of the resonance circuit is observed. Namely, although the amount of the attenuation of the common mode signal is reduced, a constant amount of attenuation can be obtained in a broad band. Further, by connecting the resistor to the resonance circuit, inputted electric power of the common mode signal is partially lost by the resistor.

In order to confirm that such a loss of the electric power of the common mode signal is actually generated not only in the equivalent circuit but also in the structure shown in FIG. 1, the ratio, transmission, and reflection of the inputted electric power of the common mode signal were examined, in a case that the passive two-terminal networks CM1A to CM1D in FIG. 1 were the short-circuit lines, and in a case that they were resistive films of 50 ohms.

Figure 5:
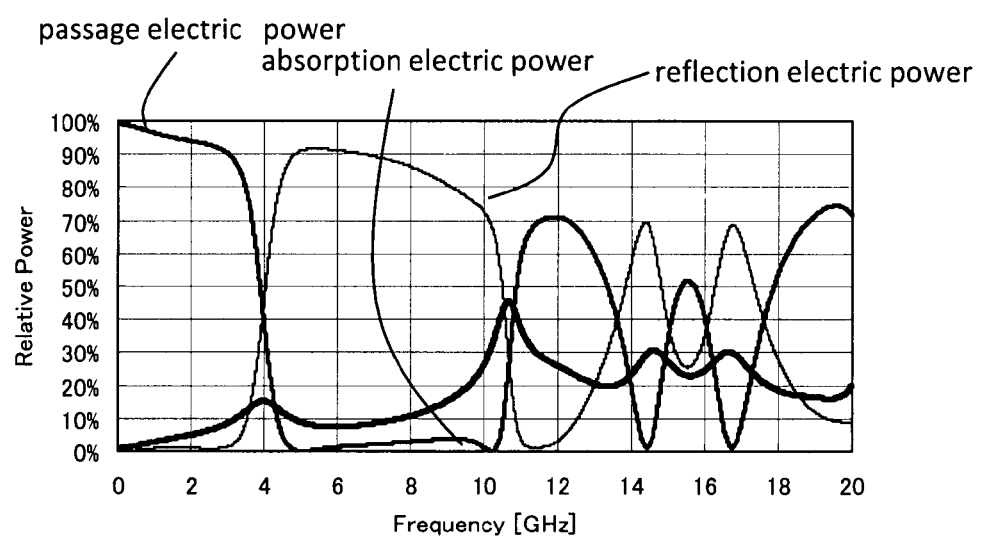
FIG. 5 is an electric power distribution characteristic view of the common mode filter of FIG. 1.

FIG. 5 shows the ratio of the transmission and the ratio of the reflection of the common mode signal for every frequency, with the electric power of the common mode signal inputted into the common mode filter F defined as 100%, in a case that the passive two-terminal networks CM1A to CM1D in FIG. 1 are the short-circuit lines. Here, residual electric power calculated by subtracting transmission electric power and reflection electric power from total electric power, is the electric power of the common mode signal absorbed and consumed by the common mode filter F, and such an electric power is defined as an absorption electric power.

Figure 6:
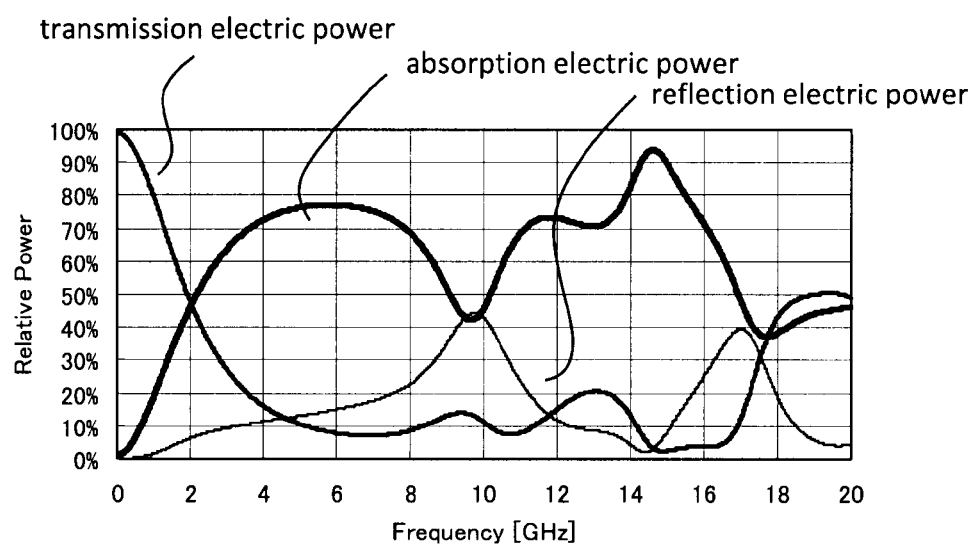
FIG. 6 is another electric power distribution characteristic view of the common mode filter of FIG. 1.

Further, FIG. 6 shows the ratio of the transmission and the ratio of the reflection of the common mode signal for every frequency, with the electric power of the common mode signal inputted into the common mode filter F defined as 100%, when the passive two-terminal networks CM1A to CM1D are the resistive films of 50 ohms.

FIG. 5 shows a state that in order to correspond to the characteristics in the attenuation band of 4 to 11 GHz of Scc(1) in FIG. 2, the reflection electric power occupies a high ratio in the range of 4 to 11 GHz, and most of the electric power of the common mode signal not passed through the common mode filter F is reflected by the input terminals. Note that although the absorption electric power is slightly generated, this seems to be caused by dielectric loss or conductor loss of members constituting the common mode filter F.

Meanwhile, FIG. 6 shows a state that in order to correspond to the characteristics in the attenuation band of 3 to 17 GHz of Scc(2) in FIG. 2, the reflection electric power occupies a low ratio, meanwhile the absorption electric power occupies a high ratio in the range of 3 to 17 GHz. Namely, FIG. 6 shows a state that most of the electric power of the common mode signal not passed through the common mode filter F is absorbed inside, and the reflection electric power is suppressed.

Figure 7:
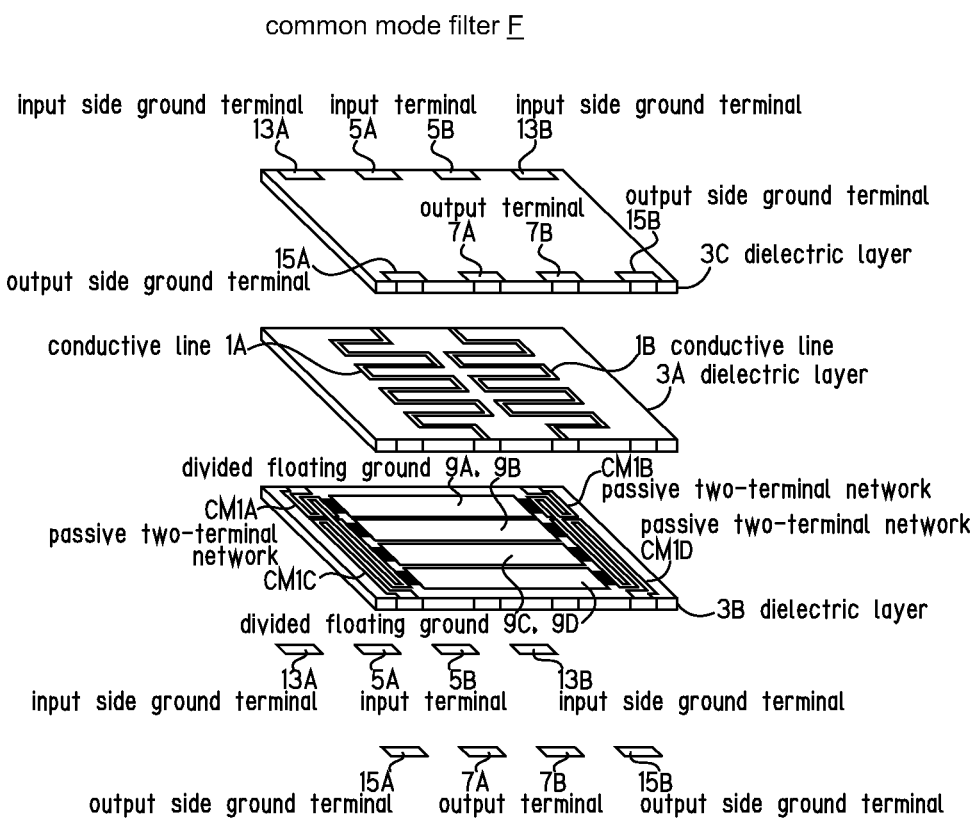
FIG. 7 is an exploded perspective view showing another embodiment of the common mode filter of the present invention.

FIG. 7 is an exploded perspective view showing another embodiment of the common mode filter F according to the present invention, wherein the passive two-terminal network is formed as a series connection of a plurality of kinds of passive two-terminal elements, wherein a plurality of floating grounds share one passive two-terminal network.

In the structure of FIG. 7, the divided floating grounds 9A to 9D are formed by further dividing the divided floating grounds in FIG. 1, and also the passive two-terminal networks CM1A and CM1B connected to the input side ground terminals 13A and 13B, and the passive two-terminal networks CM1C and CM1D connected to the output side ground terminals 15A and 15B, are formed by the series circuit of a meander inductor and resistor with larger values than the values of the short-circuit lines.

The divided floating ground 9A is connected to the input side ground terminals 13A and 13B, through the passive two-terminal networks CM1A and CM1B composed of the series circuit of the resistor and the inductor which form the passive two-terminal network respectively. The divided floating grounds 9B to 9D are connected to the output side ground terminals 15A and 15B, through the passive two-terminal networks CM1C and CM1D composed of the resistor and the inductor, being the passive two-terminal elements, respectively.

Particularly, the passive two-terminal circuits CM1C and CM1D share parallel connection to the divided floating grounds 9B to 9D, and the inductance values are set to be larger than the values of the passive two-terminal networks CM1A and CM1B.

With this structure, the divided floating grounds 9A to 9D are divided into further plural numbers, to thereby obtain plural values of the inductance of the passive two-terminal networks CM1A to CM1D connected to the divided floating grounds 9A to 9D respectively. Thus, the resonance frequency is also divided into plural numbers, and a broad attenuation band of the common mode signal can be obtained.

Further, owing to a large value of the inductance, an effect of obtaining a further deep attenuation amount can be obtained by each resonance frequency, and an effect of widening the attenuation band of the common mode signal to a low frequency side, can be expected. "Q" of the resonance circuit drops by the resistor, and therefore constant attenuation characteristics of the common mode signal can be obtained in a broad frequency band.

Figure 8:
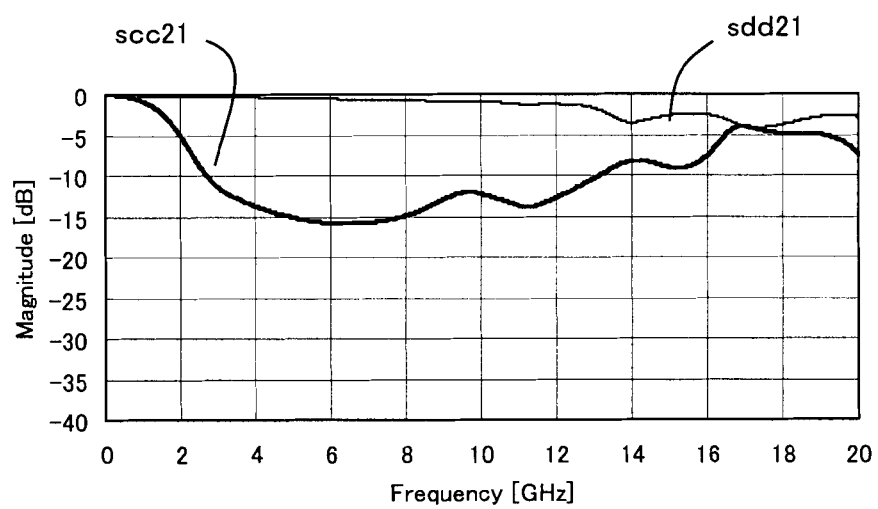
FIG. 8 is a transmission characteristic view of the common mode filter of FIG. 7.

As a result, with this structure, as shown by Scc21 of FIG. 8, the attenuation amount of the common mode signal of 10 dB or more can be obtained in a band of about 3 to 13 GHz.

Figure 9:
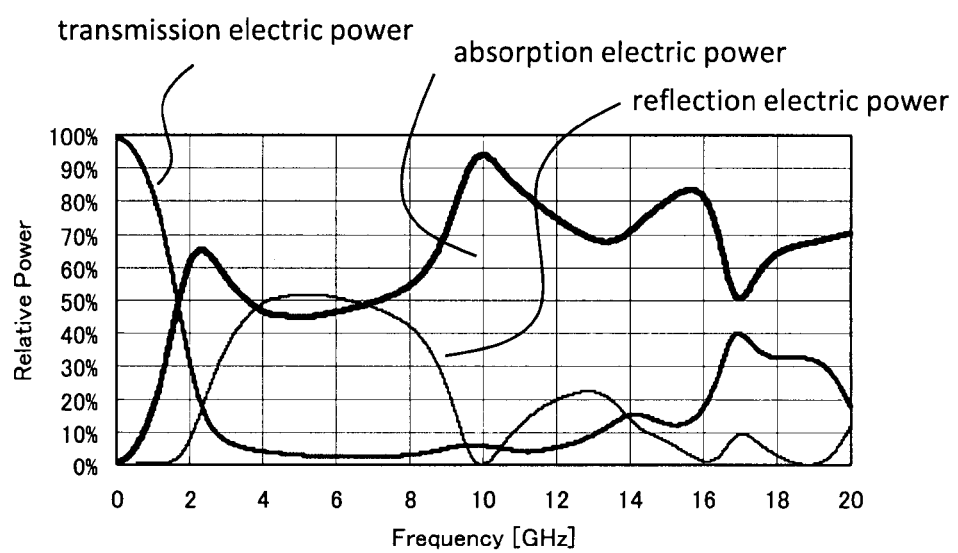
FIG. 9 is an electric power distribution characteristic view of the common mode filter of FIG. 7.

FIG. 9 shows the ratio of the transmission electric power, reflection electric power, and absorption electric power, for the inputted electric power of the common mode signal, in the common mode filter F having the transmission characteristic Scc21 of FIG. 8, and shows a state that absorption of the electric power of the common mode signal is generated by the resistor in the same way as shown in FIG. 6.

In the explanation given above, an example is given such that the common mode filter F of the present invention is the micro strip distribution constant type differential transmission line, being a distribution constant type differential transmission line.

However, in the common mode filter F of the present invention, the distribution constant type differential transmission line wherein a pair of conductive lines face the grounds vertically through the dielectric material, namely, a strip distribution constant type differential conductive line can also be used.

Next, explanation will be given for the strip distribution constant type differential conductive line, as the common mode filter F of the present invention.

Figure 10:
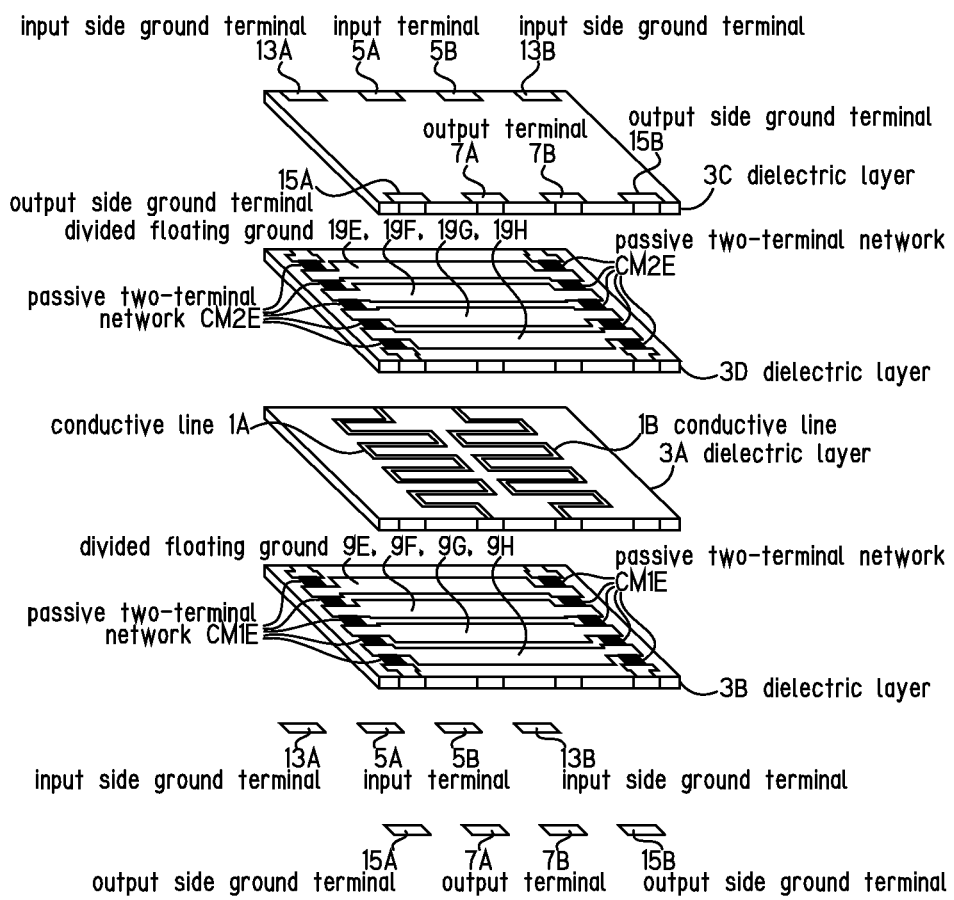
FIG. 10 is an exploded perspective view showing another embodiment of the common mode filter of the present invention.

FIG. 10 is an exploded perspective view showing the common mode filter F of the present invention using the strip distribution constant type differential conductive line.

In FIG. 10, in the same way as FIG. 1, dielectric layer 3B similar to that of FIG. 1 is disposed under the dielectric layer 3A.

On the same one surface (upper surface in FIG. 10) of the dielectric layer 3B, slender divided floating grounds 9E, 9F, 9G, 9H similar to those of FIG. 7 are formed in parallel to each other closely at slight intervals, so as to cross an input/output direction of the conductive lines 1A and 1B.

At both ends of the individual divided floating grounds 9E to 9H, the passive two-terminal networks CM1E, composed of resistors (for example 50 ohms) formed by printing, etc, are connected between the adjacent divided floating grounds 9E to 9H.

Both ends of the input side divided floating ground 9E are connected to the input side ground terminals 13A and 13B through the passive two-terminal networks CM1E, composed of resistors, and both ends of the output side divided floating ground 9H are connected to the output side ground terminals 15A and 15B.

A dielectric layer 3D made of the same material as the material of the dielectric layer 3A and composed of the dielectric substrate with the same shape, is disposed above the dielectric layer 3A, between the dielectric layer 3A and the dielectric layer 3C with the same shape as the dielectric layer 3A.

On one surface (upper surface in FIG. 10) of the dielectric layer 3D, slender divided floating grounds 19E, 19F, 19G, and 19H extending so as to cross the input/output direction of the conductive lines 1A and 1B or orthogonal thereto, are formed in parallel with each other, closely at slight intervals. The individual divided floating grounds 19E to 19H have the same shapes as the divided floating grounds 9E to 9H, and are formed at positions overlapped with them.

At both ends of the individual divided floating grounds 19E to 19H, the passive two-terminal networks CM2E, composed of resistors (for example 50 ohms formed by printing, etc, are connected between the adjacent divided floating grounds 19E to 19H.

The input side divided floating ground 19E is connected to the input side ground terminals 13A and 13B through the passive two-terminal networks CM2E composed of resistors, and the output side divided floating ground 19H is connected to the output side ground terminals 15A and 15B through the passive two-terminal networks CM2E composed of resistors.

Then, mutually different dielectric layers 3A, 3B, 3D, and 3C are overlapped one another and integrally formed into a chip shape.

The input/output terminals 5A, 5B, 7A, 7B and the input/output side ground terminals 13A, 13B, 15A, 15B formed on the dielectric layers 3A, 3B, 3C, 3D, are similarly integrally formed, when the dielectric layers 3A to 3D are overlapped one another and integrally formed into the chip shape.

Note that in the structure of FIG. 10, the dielectric layer 3A, the divided floating grounds 9E to 9H, and the passive two-terminal networks CM1E function respectively, as a first dielectric layer, first divided floating grounds, and first passive two-terminal networks. Meanwhile, the dielectric layer 3D, the divided floating grounds 19E to 19H, and the passive two-terminal networks CM2E function respectively as a second dielectric layer, second divided floating grounds (second floating grounds), and second passive two-terminal networks.

In the structure shown in FIG. 10, the input side and the output side divided floating grounds 9E, 9H, 19E, and 19H are connected to external grounds through the passive two-terminal networks CM1E and CM2E, and also the passive two-terminal networks CM1E and CM2E are connected between the adjacent divided floating grounds 9E to 9H, and 19E to 19H.

Figure 11:
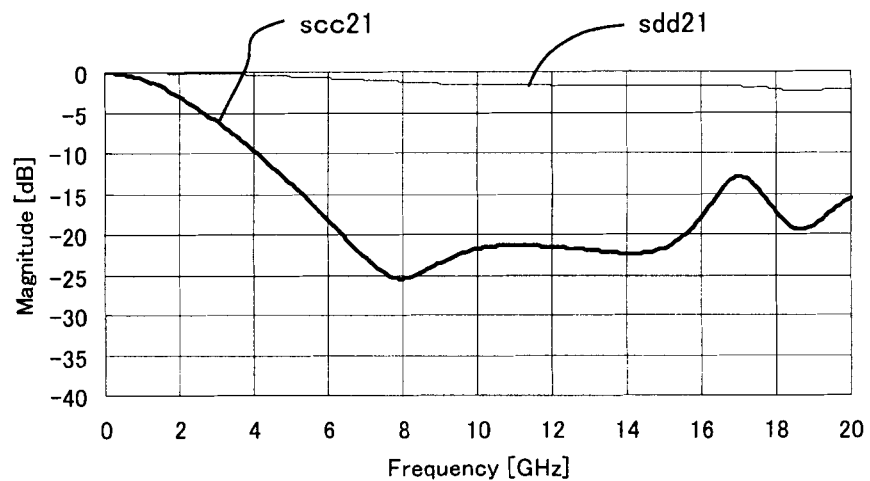
FIG. 11 is a transmission characteristic view of the common mode filter of FIG. 10.

FIG. 11 shows the characteristics of the common mode filter F shown in FIG. 10, wherein the differential conductive line has a delay time of 100 ps, and Sdd 21 shows differential signal transmission characteristics, and Scc21 shows common mode signal transmission characteristics. It is found that both characteristic are sufficient as the characteristics of the common mode filter F.

Figure 12:
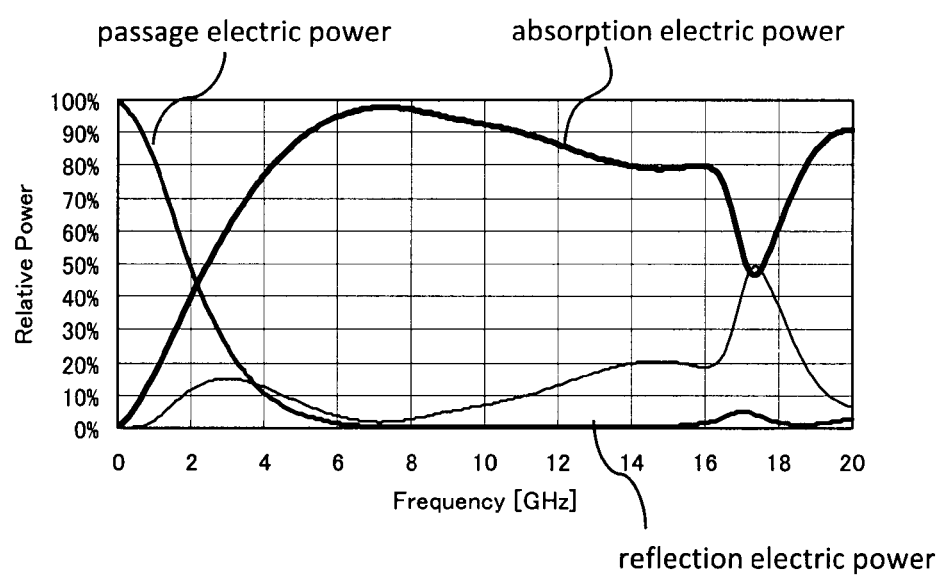
FIG. 12 is an electric power distribution characteristic view of the common mode filter of FIG. 10.

Further, the common mode filter F exhibits a great effect as follows. Namely, a major portion of the inputted electric power of the common mode signal is absorbed by the passive two-terminal networks CM1E and CM2E, and resonance of the circuit is used for obtaining the attenuation characteristics of the common mode signal, and energy is absorbed by 20 resistors in total with resistance value of 50 ohms, being the passive two-terminal networks CM1E and CM2E. Therefore, as shown in FIG. 12, excellent distribution characteristics can be obtained.

Further, many resistors of 50 ohms such as 20 resistors in total, are disposed as the passive two-terminal networks CM1E and CM2E. However, they are formed by resistor paste using a printing method, and the dielectric layers 3B and 3D have the same shapes. Therefore, productivity is extremely excellent.

Further, variation of the resistors, being the passive two-terminal networks CM1 and CM2, has extremely little influence on the characteristics. Accordingly, adjustment of the resistance value is not required.

Although not shown, in the structure of FIG. 10, if the function of the common mode filter F is exhibited by the first divided floating grounds 9E to 9H and the first passive two-terminal networks CM1E, the function of the common mode filter F can be maintained in spite of a slight deterioration of the characteristics, even if the passive two-terminal networks CM2E are not connected to the second divided floating grounds 19E to 19H, or the second divided floating grounds 19E to 19H are not divided.

In this case, the second floating ground functions as a ground for impedance matching for the differential signal, and the function of the common mode filter F is maintained only by the first divided floating grounds 9E to 9H.

Further, although not shown, in this structure, the function of the common mode filter F is maintained in spite of the deterioration of the characteristics, even in a state that the passive two-terminal networks CM1E are not connected to any one of the divided floating grounds 9E to 9H, and the passive two-terminal networks CM2E are not connected to anyone of the divided floating grounds 19E to 19H, namely even in a case that both the first divided floating ground and the second floating ground have incomplete structures. The passive two-terminal networks need not to be connected to all divided floating grounds.

Explanation has been given for a case that in the aforementioned common mode filter F, the micro-strip line or the strip line formed by a rectangular meander line, is used in the conductive lines 1A and 1B. However, in the common mode filter F of the present invention, a spiral-shaped distribution constant line can also be used in the conductive line.

Therefore, next, explanation will be given for a case that the spiral-shaped distribution constant type differential conductive line is used as the common mode filter F of the present invention.

Figure 13:
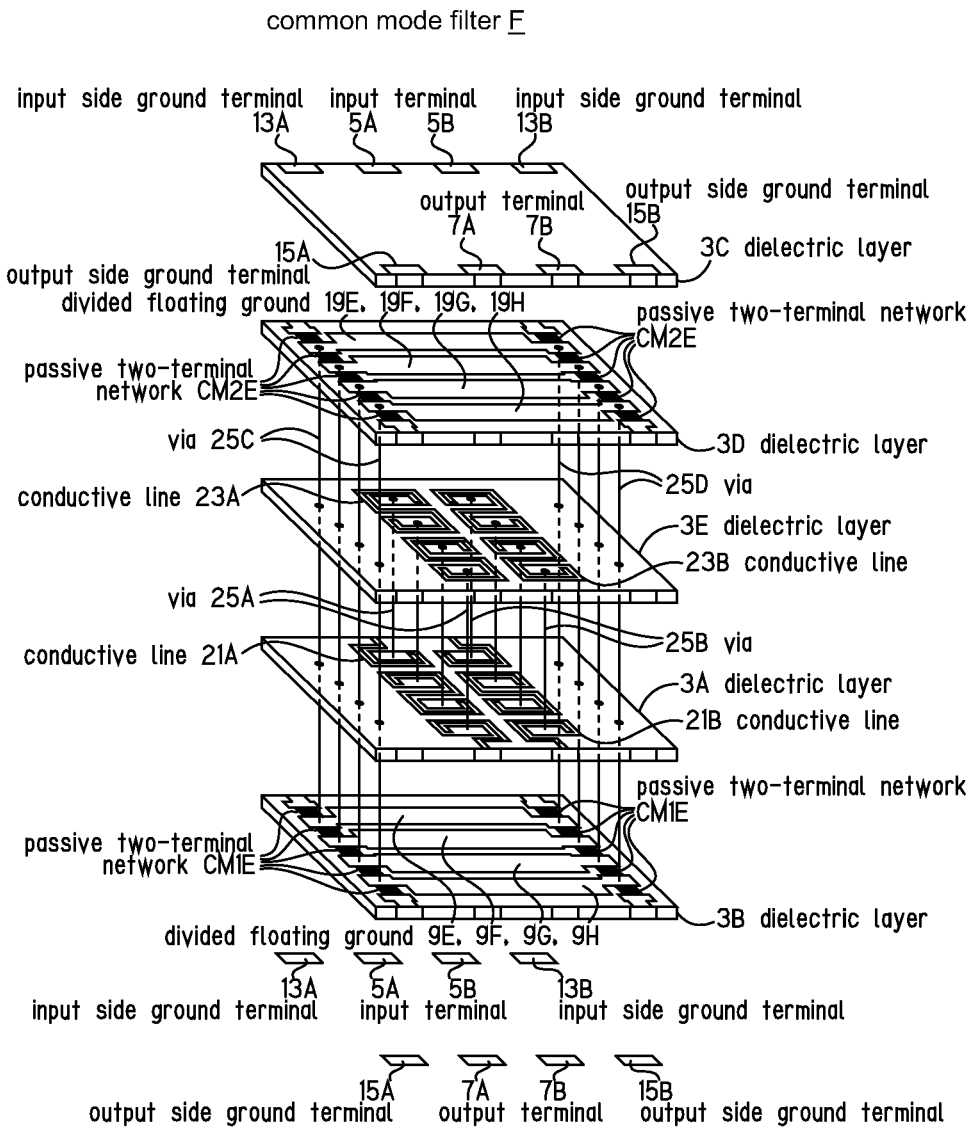
FIG. 13 is an exploded perspective view showing another embodiment of the common mode filter of the present invention.

FIG. 13 is an exploded perspective view showing the common mode filter F of the present invention, wherein the spiral-shaped distribution constant type differential conductive line is used.

FIG. 13 shows a state that in a strip line structure shown in FIG. 10, a dielectric layer 3E composed of the dielectric substrate, being a similar layer as the dielectric layer 3A, is inserted between the dielectric layer 3A and the dielectric layer 3D, together with the dielectric layer 3A.

In addition, spiral conductive lines 21A and 21B are formed on the dielectric layer 3A, and spiral conductive lines 23A and 23B are formed on the dielectric layer 3E by a method such as a printing method.

A plurality of spiral conductive lines 21A, 21B, 23A, and 23B are formed, with a plurality of unit spiral coils arranged in a direction crossing the divided floating grounds 9E to 9H and 19E to 19H at slight intervals, and are composed of such independent unit spiral coils and a pair of unit spiral coils connected adjacently in series.

Further, the center of the unit spirals in the conductive line 21A and the center of the unit spirals in the conductive line 23A, and the center of the unit spirals in the conductive line 21B and the center of the unit spirals in the conductive line 23B, are connected by via 25A, 25B, to thereby form a coupled spiral coil.

Namely, the unit spiral coils of the spiral conductive lines 21A and 23A are alternately connected in series between the input/output terminals 5A and 7A, and the unit spiral coils of the spiral-shaped conductive lines 21B and 23B are alternately connected in series between the input/output terminals 5B and 7B.

The coupled spiral coil closest to the input terminals 5A and 5B has a distributed capacitance by being sandwiched vertically by the divided floating grounds 9E and 19E, with a dimension that falls within widths of the divided floating grounds 9E and 19E. Thus, although the inductance is a lumped constant type, the capacitance is a distribution constant type, and therefore the distribution constant type line is formed.

Similar coupled spiral coils are sandwiched between the divided floating grounds 9F and 19F, between 9G and 19G, and between 9H and 19H.

Further, the divided floating grounds 9E and 19E, 9F and 19F, 9G and 19G, and 9H and 19H, are mutually connected by via 25C, 25D passing through a part that avoids the conductive lines 21A, 21B, 23A, and 23B.

Figure 14:
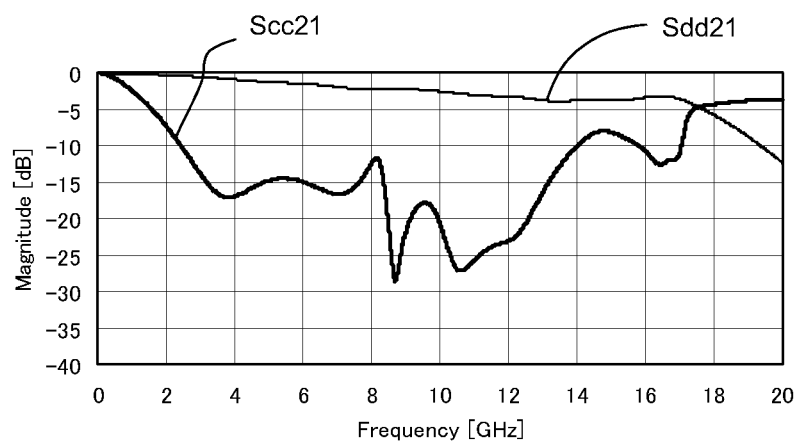
FIG. 14 is a transmission characteristic view of the common mode filter of FIG. 13.

FIG. 14 shows the differential signal transmission characteristics Sdd21 and the common mode signal transmission characteristics Scc21, when the delay time is set to about 200 ps, in the common mode filter F shown in FIG. 13. The passive two-terminal networks CM1E are set to 50 ohms, and the CM2E are set to 100 ohms.

Compared with the structure of FIG. 10, by increasing the delay time, the time constant of the composite series resonance circuit for the common mode signal is also increased. Therefore, the frequency band in which the common mode signal is attenuated, is shifted to a lower side, and the common mode filter which can be used in a band from the vicinity of 3 GHz can be obtained.

Figure 15:
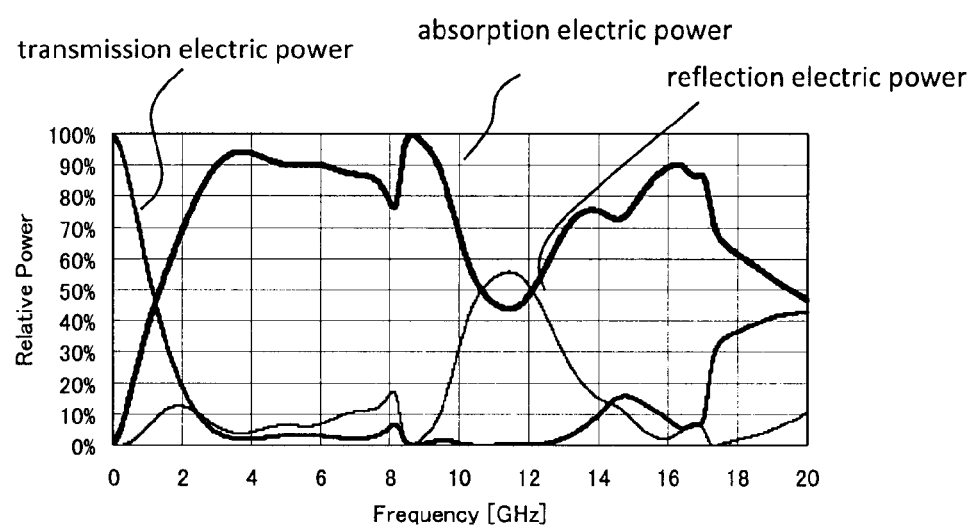
FIG. 15 is an electric power distribution characteristic view of the common mode filter of FIG. 13.
Figure 16:
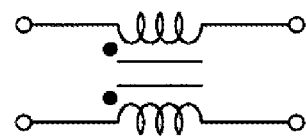
FIG. 16 is a circuit view showing a conventional common mode filter.
Figure 17:
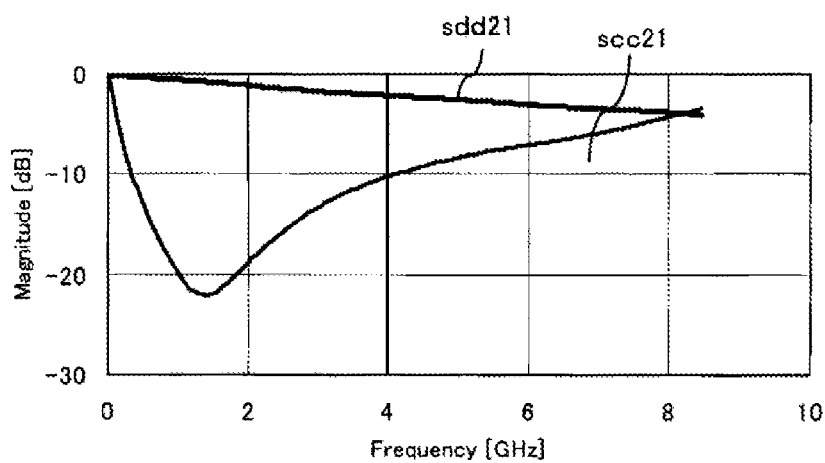
FIG. 17 is a characteristic view of the conventional common mode filter shown in FIG. 16.

FIG. 15 shows the distribution characteristics of the electric power of the common mode signal inputted into the common mode filter F shown in FIG. 13. From this figure, it is found that in the structure of the present invention, although the reflection electric power is slightly increased in the vicinity of 11 GHz, approximately excellent absorption of the electric power can be obtained.

As described above, according to the example of the present invention, for the convenience of the explanation, examples of arranging the input side ground terminals 13A, 13B and the input terminals 5A, 5B side by side, and arranging the output side ground terminals 15A, 15B and the output terminals 7A, 7B side by side, are given.

However, when the common mode filter F as an electronic component is used for small-sized electronic equipment, further more miniaturization than that shown in FIG. 1 is requested.

In such a case, only the input terminals 5A and 5B are disposed on one side of a rectangular chip component, and only the output terminals 7A and 7B are disposed on an opposite side thereof, and the input/output side ground terminals 13A, 13B, 15A, and 15B are collected together on a side and a bottom surface where the input/output terminals 5A, 5B, 7A, and 7B are not disposed, which are required to be disposed as common terminals. In this case, the input/output ground terminals 13A, 13B, 15A, and 15B can be integrally formed.

Then, in the common mode filter F of the present invention as well, wherein the spiral-shaped distribution constant type differential transmission line is used, various combinations of the above-described structures are possible, in the same way as the structure using the distribution constant type differential conductive line formed by the strip line or the micro-strip line.

Further, in the divided floating grounds 9A to 19H, the passive two-terminal networks CM1A to CM2E can be connected between all adjacent grounds or between apart of the grounds.

In the above-described embodiment, explanation has been given for a case that a plurality of passive two-terminal networks CM1A to CM2E used for one common mode filter F are all the same kind of passive elements or are combination of the resistors and the inductors.

Namely, FIG. 1 shows an example of using four short-circuit lines or four resistors, and FIG. 7 shows an example of using four inductors and eight resistors, and FIG. 10 and FIG. 13 show examples of using twenty resistors.

However, in the present invention, the inductor, short-circuit lines, capacitors, and resistors can be arbitrarily combined and used, as the passive two-terminal networks CM1A to CM2E in one common mode filter F.

Further, the common mode filter F of the present invention can also be constituted not only as a single component, but also as a component combined with other functional component.

For example, when the common mode filter F of the present invention is incorporated into a differential delay line, being an electronic component, the divided floating ground may be constituted so that the passive two-terminal networks are connected to the divided floating grounds of the number corresponding to the required lengths and the residual portion is not connected to the passive two-terminal network, if the delay time of the differential delay line is more than the delay time required for the common mode filter F.

Further, as examples of the distribution constant type differential conductive lines having the divided floating grounds wherein a pair of conductive lines face with each other, with the dielectric layer interposed between them, three kinds of lines such as micro-strip line, strip line, and spiral line are given.

However, based on a theoretical technical concept of the present invention, it is found that the cross-sectional shapes of the pair of conductive lines are not necessarily planar rectangular shapes juxtaposed on the same plane, and further the grounds having a pair of conductive lines faced with each other with the dielectric body interposed between them, are not necessarily a planar face.

For example, even in a case that insulated conductive wires, being twisted pair, are covered with an insulating material that functions as a dielectric body, and its circumference is covered roundly with a conductor, being a ground, and a plurality of them are continuously arranged so as not to be brought into contact with each other, the ground can function as the divided floating ground. Thus, the effect of the present invention can be realized.

Further, in the present invention, analysis is made on the assumption that a pair of conductive lines have the same delay time. However, the conductive lines may have difference in the delay time. Thus, when a phase shift is generated between the differential signals, the effect of correcting the phase shift and the attenuation of the common mode signal can be simultaneously obtained by the common mode filter F.

DESCRIPTION OF SIGNS AND NUMERALS 1A, 1B, 21A, 21B, 23A, 23B Conductive lines
3A, 3B Dielectric layers (first dielectric layers)
3C Dielectric layer (second dielectric layer)
3D Dielectric layer
3E Dielectric layer (first dielectric layer)
5A, 5B Input terminals
7A, 7B Output terminals
9A, 9B, 9C, 9D, 9E, 9F, 9G, 9H Divided floating grounds (first divided floating grounds)
13A, 13B Input side ground terminals
15A, 15B Output side ground terminals
17 Capacitor between divided floating grounds
19E, 19F, 19G, 19H Divided floating grounds (second floating grounds)
25A, 25B, 25C, 25D Via
21A, 21B Spiral-shaped conductive lines
23A, 23B Spiral-shaped conductive lines
CM1A, CM1B, CM1C, CM1D, CM1E Passive two-terminal network (first passive two-terminal network)
CM2E Passive two-terminal networks (Second passive two-terminal networks)
F Common mode filter

What is claimed is:

1. A common mode filter, comprising:
   a pair of conductive lines formed on a first dielectric layer to transmit a differential signal;
   a plurality of first divided floating grounds separated from an external ground potential in such a manner as to face the pair of conductive lines, with the first dielectric layer interposed between the plurality of first divided floating grounds and the pair of conductive lines, and the plurality of first divided floating grounds are disposed in a length direction of the pair of conductive lines, thus forming a distribution constant type differential transmission line for the differential signal, together with the pair of conductive lines; and
   a first passive two-terminal network including resistors connected between the plurality of first divided floating grounds and the external ground potential; the first passive two-terminal network located at least at an input side or an output side of the plurality of first divided floating grounds.

2. The common mode filter according to claim 1, wherein the plurality of first divided floating grounds are constituted as a pair of first divided floating grounds respectively at the input side and the output side.

3. The common mode filter according to claim 2, wherein the first passive two-terminal network is also connected between all adjacent grounds of the plurality of first divided floating grounds or a part of the adjacent grounds of the plurality of first divided floating grounds.

4. The common mode filter according to claim 1, wherein the plurality of first divided floating grounds comprises three or more first divided floating grounds.

5. The common mode filter according to claim 4, wherein the first passive two-terminal network has a plurality of passive two-terminal circuits, in which at least the plurality of passive two-terminal circuits on the input side or the output side are connected to the plurality of first divided floating grounds.

6. The common mode filter according to claim 1, wherein the pair of conductive lines are respectively formed into meander shapes.

7. The common mode filter according to claim 1, wherein it of conductive lines are formed on a dielectric substrate, being the first dielectric layer, and the plurality of first divided floating grounds are formed on a dielectric substrate different from the aforementioned dielectric substrate, and such different dielectric substrates are formed by integral lamination.

8. The common mode filter, comprising:
   a pair of conductive lines formed on a first dielectric layer to transmit a differential signal;
   a plurality of first divided floating grounds separated from an external ground potential in such a manner as to face the pair of conductive lines, with the first dielectric layer interposed between the plurality of first divided floating grounds and the pair of conductive lines, and the plurality of first divided floating grounds are disposed in a length direction of the pair of conductive lines, thus forming a distribution constant type differential transmission line for the differential signal, together with the pair of conductive lines; and
   a first passive two-terminal network connected between the plurality of first divided floating grounds and the external ground potential; the first passive two-terminal network located at least at an input side or an output side of the plurality of first divided floating grounds;
   and wherein the pair of conductive lines comprises a plurality of spiral conductive lines connected in series in a length direction.

9. The common mode, comprising:
   a pair of conductive lines formed on a first dielectric layer to transmit a differential signal;
   a plurality of first divided floating grounds separated from an external ground potential in such a manner as to face the pair of conductive lines, with the first dielectric layer interposed between the plurality of first divided floating grounds and the pair of conductive lines, and the plurality of first divided floating grounds are disposed in a length direction of the pair of conductive lines, thus forming a distribution constant type differential transmission line for the differential signal, together with the pair of conductive lines;

a first passive two-terminal network connected between the plurality of first divided floating grounds and the external ground potential; the first passive two-terminal network located at least at an input side or an output side of the plurality of first divided floating grounds; and a second floating ground, which is separated from the external ground potential and is formed in such a manner as to face the pair of conductive lines, with a second dielectric layer interposed between the second floating ground and the pair of conductive lines.

10. The common mode filter according to claim 9, comprising a second passive two-terminal network, which is connected between the second floating ground and the external ground potential.

11. The common mode filter according to claim 9, wherein the second floating ground is divided into a plurality of second divided floating grounds in the length direction of the pair of conductive lines, and a second passive two-terminal network is connected between the plurality of second divided floating grounds and the external ground potential; and the second passive two-terminal network located at least at an input side or an output side of the plurality of second divided floating grounds.

12. The common mode filter according to claim 9, wherein a second passive two-terminal network is also connected between all adjacent grounds of a plurality of second divided floating grounds or a part of the adjacent grounds of the plurality of second divided floating grounds.

13. The common mode filter according to claim 9, wherein the pair of conductive lines are formed on a dielectric substrate, being the first dielectric layer, and the plurality of first divided floating grounds are formed on a dielectric substrate different from the aforementioned dielectric substrate, and the second floating ground is formed on a second dielectric substrate, being the second dielectric layer, and such different dielectric substrates are formed by integral lamination.

14. The common mode filter according to claim 9, further comprising: a second passive two-terminal network wherein the first and the second passive two-terminal networks are short circuit lines.

15. The common mode filter according to claim 9, further comprising: a second passive two-terminal network wherein the first and the second passive two-terminal networks are formed by an inductor, a capacitor, a resistor, or a combination thereof, being one or more passive elements.

* * * * *